(12) United States Patent
Lan et al.

(10) Patent No.: US 10,084,010 B2
(45) Date of Patent: Sep. 25, 2018

(54) VARIABLE LED DISPLAY SCREEN

(71) Applicant: GLUX VISUAL EFFECTS TECH(SHENZHEN) CO., LTD., Shenzhen (CN)

(72) Inventors: Ming Lan, Shenzhen (CN); Yuancai Xu, Shenzhen (CN)

(73) Assignee: GLUX VISUAL EFFECTS TECH (SHENZHEN) CO., LTD., Shenzhen, Guangdong (CN)

( * ) Notice: Subject to any disclaimer, the term of this patent is extended or adjusted under 35 U.S.C. 154(b) by 81 days.

(21) Appl. No.: 15/038,683

(22) PCT Filed: Jul. 2, 2015

(86) PCT No.: PCT/CN2015/083174
§ 371 (c)(1),
(2) Date: May 23, 2016

(87) PCT Pub. No.: WO2016/176905
PCT Pub. Date: Nov. 10, 2016

(65) Prior Publication Data
US 2017/0033154 A1    Feb. 2, 2017

(30) Foreign Application Priority Data

May 6, 2015 (CN) .......................... 2015 1 0227454

(51) Int. Cl.
*F21V 21/00* (2006.01)
*H01L 27/15* (2006.01)
(Continued)

(52) U.S. Cl.
CPC .......... *H01L 27/156* (2013.01); *G06F 3/1446* (2013.01); *G09F 9/3026* (2013.01);
(Continued)

(58) Field of Classification Search
CPC ....... H01L 27/156; G06F 3/1446; G09G 3/32; G09G 3/33; G09F 9/3026; G09F 9/33;
(Continued)

(56) References Cited

U.S. PATENT DOCUMENTS 6,054,968 A * 4/2000 De Matteo .......... G09F 15/0068
312/7.2
6,729,054 B1 * 5/2004 VanderTuin .............. G09F 9/30
16/236

(Continued)

FOREIGN PATENT DOCUMENTS

CN    201956018    8/2011
CN    202736407    2/2013
(Continued)

*Primary Examiner* — Bryon T Gyllstrom
*Assistant Examiner* — James Endo
(74) *Attorney, Agent, or Firm* — Hamre, Schumann, Mueller & Larson, P.C.

(57) ABSTRACT

A variable LED display screen includes a plurality of LED modules and a plurality of mounting assemblies arranged among adjacent LED modules and configured to connecting the LED modules together to form the display screen. The mounting assemblies are adjustable mounting assemblies, the mounting assemblies can finely adjust the relative gaps between adjacent LED modules connected with the mounting assemblies, and the adjustable mounting assemblies includes an X-axis adjustable mounting member, a Y-axis adjustable mounting member and a middle adjustable mounting member. The variable LED display screen of the present invention not only allows size adjustment of the LED display screen, but also allows shape adjustment of the LED display screen. In addition, multiple accessories can be connected to the display screen to extend functions of the display screen.

16 Claims, 6 Drawing Sheets

(51) Int. Cl.
*G09G 3/32* (2016.01)
*G06F 3/14* (2006.01)
*H01L 33/62* (2010.01)
*F21V 19/00* (2006.01)
*F21V 21/14* (2006.01)
*F21S 2/00* (2016.01)
*G09F 9/37* (2006.01)
*G09F 9/302* (2006.01)
*G09F 9/33* (2006.01)

(52) U.S. Cl.
CPC ............... *G09G 3/32* (2013.01); *H01L 33/62* (2013.01); *F21S 2/005* (2013.01); *F21V 19/0015* (2013.01); *F21V 19/0055* (2013.01); *F21V 21/14* (2013.01); *G09F 9/302* (2013.01); *G09F 9/33* (2013.01); *G09F 9/37* (2013.01)

(58) Field of Classification Search
CPC ... G09F 9/37; G09F 9/302; G09F 9/30; G09F 9/301; G09F 15/0068; F21V 14/02; F21V 14/025; F21V 17/002; F21V 17/02; F21V 17/04; F21V 17/06; F21V 17/12; F21V 19/0015; F21V 19/003; F21V 19/0055; F21V 19/0035; F21V 21/14; F21V 21/145; F21S 2/005; F21S 4/28
USPC ............ 362/249.03, 249.04, 249.06, 249.07, 362/249.08, 249.09, 238, 239; 345/1.3, 345/82
See application file for complete search history.

(56) References Cited

U.S. PATENT DOCUMENTS 8,371,894 B1* 2/2013 Rosen ................. A63H 33/086
446/102

2001/0024368 A1* 9/2001 Henrici ................... F21S 2/005
362/235
2003/0234343 A1* 12/2003 Cok ........................ G02B 6/06
250/208.1
2005/0023423 A1 2/2005 Chin et al.
2005/0178034 A1* 8/2005 Schubert .................. G09F 9/33
40/605
2005/0265024 A1* 12/2005 Luk ........................ F21S 10/02
362/231
2006/0209547 A1* 9/2006 Biondo ..................... G09F 9/33
362/388
2008/0244944 A1* 10/2008 Nall ........................ G09F 13/04
40/544
2009/0116244 A1* 5/2009 Hsiao ................... H05K 1/0274
362/297
2009/0121988 A1* 5/2009 Amo ..................... G09G 3/2088
345/82
2009/0146918 A1* 6/2009 Kline ........................ G09F 9/33
345/46
2009/0303718 A1* 12/2009 Zheng ....................... F21K 9/00
362/249.02
2009/0316407 A1* 12/2009 Lin ........................... F21K 9/00
362/249.06
2010/0328943 A1* 12/2010 Takamura ................. F21S 2/00
362/235
2013/0163235 A1* 6/2013 Chuang ................... F21V 15/01
362/190
2014/0192530 A1* 7/2014 Liu .......................... H05K 5/02
362/249.02

FOREIGN PATENT DOCUMENTS

CN          202736408            2/2013
CN          203801017            8/2014
GB          1185011 A       *    3/1970

* cited by examiner

VARIABLE LED DISPLAY SCREEN

TECHNICAL FIELD

The present application relates to the field of LED display screen, and more particularly, to an LED display screen which may be changed in size and shape.

BACKGROUND

The traditional television display screen is made of a piece of screen. Therefore, its size cannot be changed, it is not convenient for users to change the size of the screen and the radian of television according to the actual situations of using places to achieve a comfortable viewing effect. In addition, the television display screen is generally larger in size and is fragile item, therefore there are also inconvenient transportation problems.

In view of the above problems, the Chinese patent document CN203801017U discloses an LED TV which includes: an LED display screen comprising a plurality of LED display units, two adjacent LED display units of the plurality of LED display units are detachably connected, the LED display screen has two side edges arranged oppositely in a first direction and a top edge and a bottom edge arranged between the two side edges.

The LED TV disclosed by the above patent document has the following shortcomings in practical use: 1. in the patent document, the supporting structure for supporting the display screen can't adapt to the size changes of the display screen, when the display screens with different sizes are produced by increasing or decreasing the number of LED display modules, the vertical and horizontal mounting parts on the supporting structure has to be reordered correspondingly, and the base also needs to be reordered, thus the production cost increases; 2. the surface of the screen can only render a single plane, can't be changed after purchase, and can't be changed according to the actual situations of the using places, and the best viewing effect can't be achieved; 3. it is not convenient to implement function expansion on TV; 4. the connecting parts between the LED display units is fixed and not adjustable, and the manufacture and assembly of the LED display unit has error, it is not possible to reduce manufacture and assembly error to the extent which does not affect the splicing gap between high-density LED modules based on the existing equipment and assembly level, resulting in the gap between LED display units being too large or too small, which affects the viewing effect.

SUMMARY

The invention aims at solving the problem existing in the prior art that: the connecting parts of the LED modules in the display screen of the LED television is not adjustable, such that the daps between LED modules is not adjustable when the LED modules are assembled to from the screen, resulting in the gap between LED display units being too large or too small, which affects the viewing effect, and the present invention propose an LED display screen comprising an adjustable connecting part and being capable of adjust the gap between adjacent LED modules to remedy the manufacturing error and assembly error of the LED module.

Further more, a variable LED display screen is provided.
To solve the technical problem mentioned above, the present invention provide a technical solution of: a variable LED display screen comprising a plurality of LED modules and a plurality of mounting assemblies arranged among adjacent LED modules and configured to connecting the LED modules together to form the display screen, wherein the mounting assemblies are adjustable mounting assemblies, the mounting assemblies are capable of finely adjusting the relative gaps between adjacent LED modules connected with the mounting assemblies.

In the variable LED display screen of the present invention, the adjustable mounting assemblies comprise an X-axis adjustable mounting member configured to adjust the relative gap between adjacent LED modules along X-axis direction, and a Y-axis adjustable mounting member configured to adjust the relative gap between adjacent LED modules along Y-axis direction.

In the variable LED display screen of the present invention, the X-axis adjustable mounting member is disposed between the LED modules formed an edge of the display screen parallel with the X-axis direction; the Y-axis adjustable mounting member is disposed between the LED modules formed the edge of the display screen parallel with the Y-axis direction: the adjustable mounting assemblies further comprise a middle adjustable mounting member which is disposed among four LED modules showing a grid pattern and is connected to a corner of each of the four LED modules to adjust the gap along X-axis direction and the gap along Y-axis direction between two adjacent LED modules of the four LED modules.

In the variable LED display screen of the present invention, the X-axis adjustable mounting member and the Y-axis adjustable mounting member are respectively provided with a connecting structure suitable for connecting with an accessory.

In the variable LED display screen of the present invention, the connecting structure is a thread hole.

In the variable LED display screen of the present invention, the accessory is a support leg for supporting the whole LED display screen, a boom for lifting the whole LED display screen, a stereo mounted on the whole LED display screen, or a cabinet hung on the lower end of the whole LED display screen.

In the variable LED display screen of the present invention, the X-axis adjustable mounting member and the Y-axis adjustable mounting member have the same structure, each of the X-axis adjustable mounting member and the Y-axis adjustable mounting member comprises a first fixing frame, a first gap adjusting mechanism mounted on the first fixing frame, and two first movable blocks movably connected to the first gap adjusting mechanism, each of the first movable block is correspondingly connected to the corner of the LED module on the same side, two ends of the first gap adjusting mechanism are respectively connected to the first movable blocks, the gap between the LED modules is adjusted by moving the first movable blocks on the two ends toward or away from each other, the connecting structure is disposed on the outer side wall of the first fixing frame.

In the variable LED display screen of the present invention, the first fixing frame is T-shaped and comprises a transverse frame and a longitudinal frame, the first gap adjusting mechanism is transversely disposed on the longitudinal frame of the first fixing frame, the two first movable blocks are respectively disposed on two sides of the longitudinal frame and are connected to the two ends of the first gap adjusting mechanism.

In the variable LED display screen of the present invention, the middle adjustable mounting member comprises:
a second fixing frame comprising a horizontal frame and a vertical frame, wherein the extending direction of the horizontal frame is defined as the X-axis direction, and the extending direction of the vertical frame is the Y-axis direction;

four second movable blocks respectively arranged on two sides of the horizontal frame and the vertical frame and showing the grid pattern, wherein the second movable blocks on two sides of the horizontal frame are movable along the X-axis direction, and the second movable blocks on two sides of the vertical frame are movable along the Y-axis direction, and one LED module is mounted on each of the second movable blocks;

at least three second gap adjusting mechanisms, respectively mounted on the horizontal frame and the horizontal frame, wherein two ends of each of the second gap adjusting mechanisms are respectively connected to two second movable blocks, the gap between the LED modules mounted on two second movable blocks is adjusted by moving the first movable blocks on the two ends toward or away from each other, the second gap adjusting mechanism mounted on the horizontal plane is a Y-axis gap adjusting mechanism, the second gap adjusting mechanism mounted on the vertical frame is an X-axis gap adjusting mechanism, the Y axis gap adjusting mechanism is movably disposed on the horizontal frame and is capable of being moved wholly along the X-axis direction, and the X-axis gap adjusting mechanism is movably disposed on the vertical frame and is capable of being moved wholly along the Y-axis direction.

In the variable LED display screen of the present invention, an X-direction strip through hole with a length extending along the X-axis direction is formed on the horizontal frame, a Y-direction strip through hole with the length extending along the Y-axis direction is formed on the vertical frame, the X-axis gap adjusting mechanism is movably disposed in the Y-direction strip through hole, and two ends of the X-axis gap adjusting mechanism extend out of the Y-direction strip through hole to be connected to two second movable blocks on the left and right, to drive the two second movable blocks to move away from or toward each other along the X-axis direction, the Y-axis gap adjusting mechanism is movably disposed in the X-direction strip through hole, and two ends of the Y-axis gap adjusting mechanism extend out of the X-direction strip through hole to be connected to two second movable blocks on the top and bottom, to drive the two second movable blocks to move away from or toward each other along the Y-axis direction.

In the variable LED display screen of the present invention, the second gap adjusting mechanism is an adjusting screw with threads at two ends, the X-axis gap adjusting mechanism is the X-axis adjusting screw and the Y axis gap adjusting mechanism is the Y axis adjusting screw, the side of the second movable block facing to the X-axis adjusting screw is provided with an X-axis thread hole suitable for connecting with the X-axis adjusting screw, the side of the second movable block facing to the Y-axis adjusting screw is provided with a Y-axis thread hole suitable for connecting with the Y-axis adjusting screw.

In the variable LED display screen of the present invention, the X-axis adjusting screw comprises an X-axis adjusting part and two X-axis thread parts fixedly connected with two ends of the X-axis adjusting part, the thread directions of the two X-axis thread parts are opposite, the two X-axis thread parts are respectively threaded to the X-axis thread holes on two sides of the X-axis adjusting screw, the thread direction of the X-axis thread holes is matched with the X-axis thread parts; the Y-axis adjusting screw comprises a Y-axis adjusting part and two Y-axis thread parts fixedly connected with two ends of the Y-axis adjusting part, the thread directions of the two Y-axis thread parts are opposite, the two Y-axis thread parts are respectively threaded to the Y-axis thread holes on two sides of the Y-axis adjusting screw, the thread direction of the Y-axis thread holes is matched with the Y-axis thread parts.

In the variable LED display screen of the present invention, the LED module is a bendable LED module.

In the variable LED display screen of the present invention, the bendable LED module comprises an elastic component layer on which a plurality of light emitting assemblies are arranged; and an adjusting part which acts on the back of the elastic component layer and pulls or pushes the two sides of the elastic component layer, to bend the elastic component layer into an inner arc or outer arc.

Compared with the prior art, the above technical solutions of the present invention have the following advantages:

1. in the present invention, the mounting assembly is served as the adjustable mounting assembly capable of adjusting the relative gap between adjacent LED modules, the size of the display screen not only may be adjusted by increasing or decreasing the number of LED modules to ease manufacture of different sizes of the LED display, but also may be adjusted during assembly procedure of assembling the LED into the display screen, thereby remedying the manufacturing error and assembly error of the LED module resulting in the gap between LED display units being too large or too small and thereby affecting the viewing effect. The variable display screen of the present invention can be applied to the television, computers and other electronic devices having a display screen.

2. in the present invention, the connecting structures provided on the X-axis adjustable mounting member and Y-axis adjustable mounting member facilitates connecting a variety of accessories to the LED display screen, which not only can extend the function of the LED display screen, but also can change the function of the LED display screen arbitrarily, especially when the support leg is directly connected to the X-axis adjustable mounting member and Y-axis adjustable mounting member through the connecting structure, so that one type of support legs may be generally used to the LED display screen with different size, thus reducing the production cost.

3. in the present invention, the variable LED display screen of the present invention can achieve change in shape by using high-definition bendable LED modules, and may be change between flat surface, curved surface and the S-shaped surface according to the actual environment.

4. in the present invention, the X-axis adjustable mounting member, Y-axis adjustable mounting member, and middle adjustable mounting member with special structure can achieve the seamless assembly between the LED modules, such that the display screen shows no black line and bright line when seen in the front and does not need to be adjusted by manually padding a material, thus the adjustment effect is good, the adjustment way is simple, and the time for adjustment is saved.

BRIEF DESCRIPTION OF THE DRAWINGS

In order to make the content of the present invention be understood more clearly, the present invention is described in detail further hereafter according to the specific embodiment of the present invention and in conjunction with the accompanying drawings, wherein.

The reference numbers in drawings are: 100—LED module, 101—X-axis adjustable mounting member, 102—Y-axis adjustable mounting member, 103—middle adjustable mounting member, 11—connecting structure, 12—support leg, 13—boom, 14—stereo, 15—cabinet, 16—first fixing frame, 17—first gap adjusting mechanism, 18—first movable block, 19—elastic component layer, 20—adjusting part, 2—second fixing frame, 21—horizontal frame, 22—vertical frame, 211—X-direction stripe through hole, 221—Y-direction strip through hole, 35—X-axis thread hole, 36—Y-axis thread hole, 4—X-axis adjusting screw, 41—X-axis adjusting part, 42—X-axis thread part, 5—Y-axis adjusting screw, 51—Y-axis adjusting part, 52—Y-axis thread parts.

DETAILED DESCRIPTION OF THE EMBODIMENT

The present invention is illustrated through the following embodiments with reference to the accompanying drawings.

Figure 1:
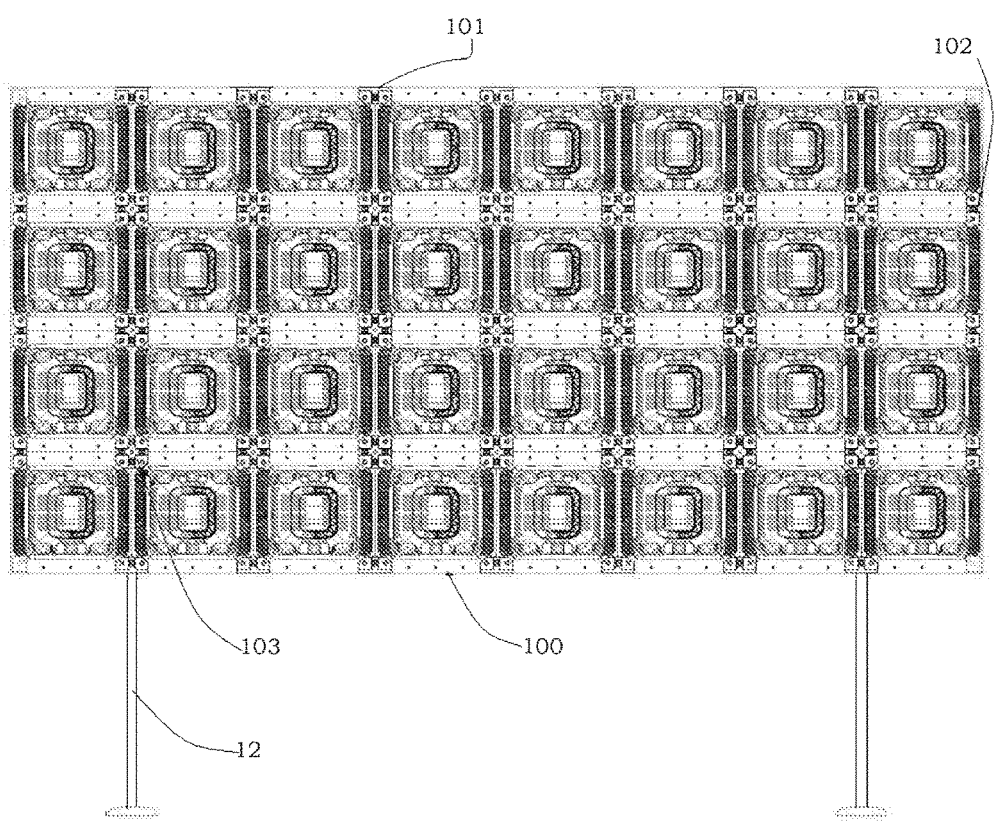
FIG. 1 is a perspective view of the variable LED display screen of the present invention supported the support legs.

As shown in FIG. 1, this embodiment provides a variable LED display screen comprising a plurality of LED modules 100 and a plurality of mounting assemblies arranged among adjacent LED modules 100 and configured to connecting the LED modules 100 together to form the display screen, the mounting assemblies are adjustable mounting assemblies, the mounting assemblies are capable of finely adjusting the relative gaps between adjacent LED modules 100 connected with the mounting assemblies.

The above technical solution is the core technical solution of the present invention. The mounting assembly is served as the adjustable mounting assembly capable of adjusting the relative gap between adjacent LED modules, the size of the display screen not only may be adjusted by increasing or decreasing the number of LED modules to ease manufacture of different sizes of the LED display, but also may be adjusted during assembly procedure of assembling the LED into the display screen, thereby remedying the manufacturing error and assembly error of the LED module resulting in the gap between LED display units being too large or too small and thereby affecting the viewing effect. The variable display screen of the present invention can be applied to the television, computers and other electronic devices having a display screen.

Specifically, the adjustable mounting assemblies 100 comprise an X-axis adjustable mounting member 101 configured to adjust the relative gap between adjacent LED modules 100 along X-axis direction, and a Y-axis adjustable mounting member 102 configured to adjust the relative gap between adjacent LED modules 100 along Y-axis direction. The X-axis adjustable mounting member 101 is disposed between the LED modules 100 formed an edge of the display screen parallel with the X-axis direction; the Y-axis adjustable mounting member 102 is disposed between the LED modules 100 formed the edge of the display screen parallel with the Y-axis direction: the adjustable mounting assemblies further comprise a middle adjustable mounting member 103 which is disposed among four LED modules 100 showing a grid pattern and is connected to a corner of each of the four LED modules 100 to adjust the gap along X-axis direction and the gap along Y-axis direction between two adjacent LED modules of the four LED modules 100.

Figure 2:
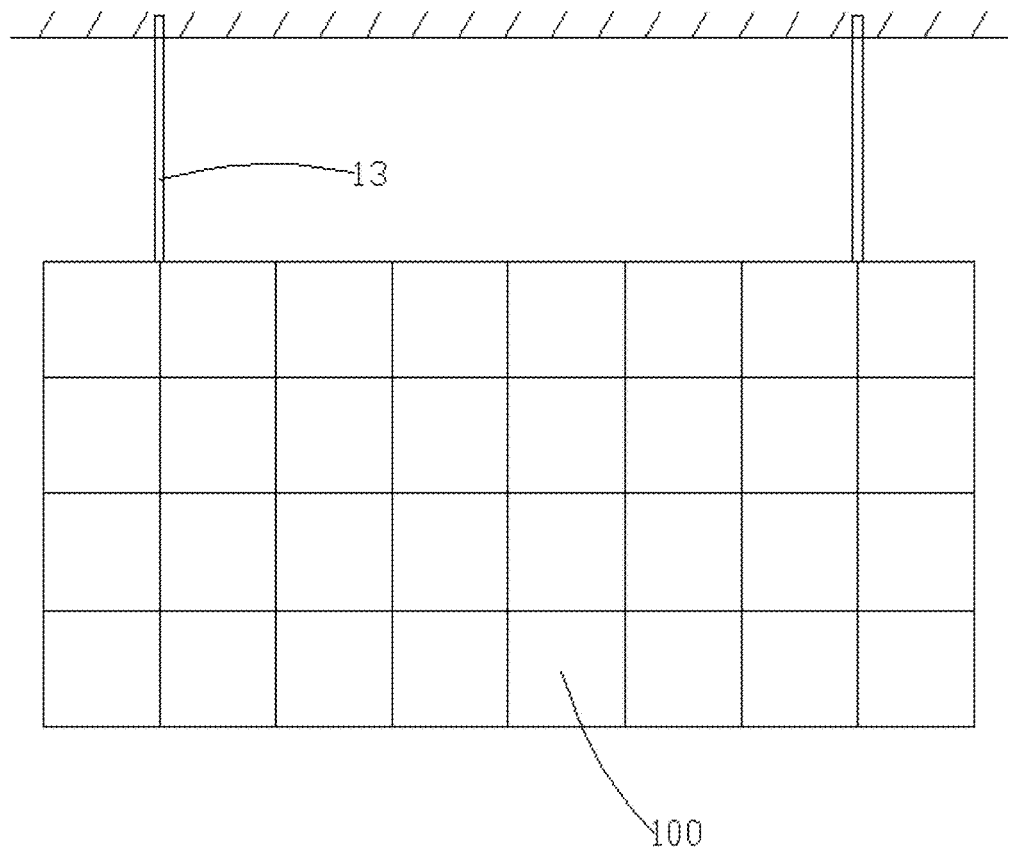
FIG. 2 is a schematic view of the variable LED display screen of the present invention mounted on the wall through the boom.
Figure 3:
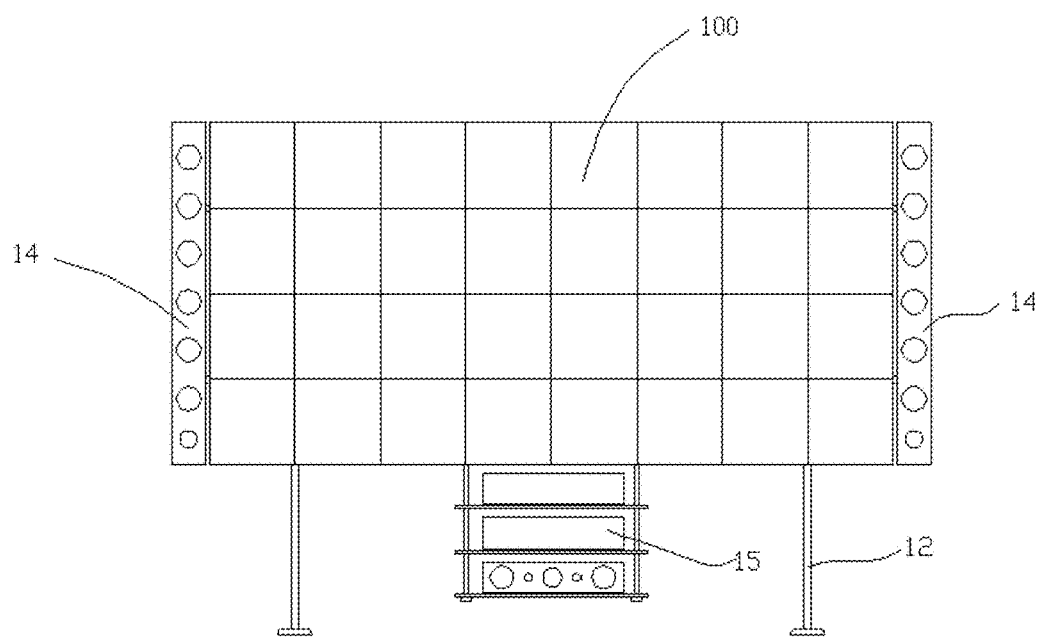
FIG. 3 is a schematic view of the variable LED display screen of the present invention connected with a stereo, a cabinet and the support legs.
Figure 8:
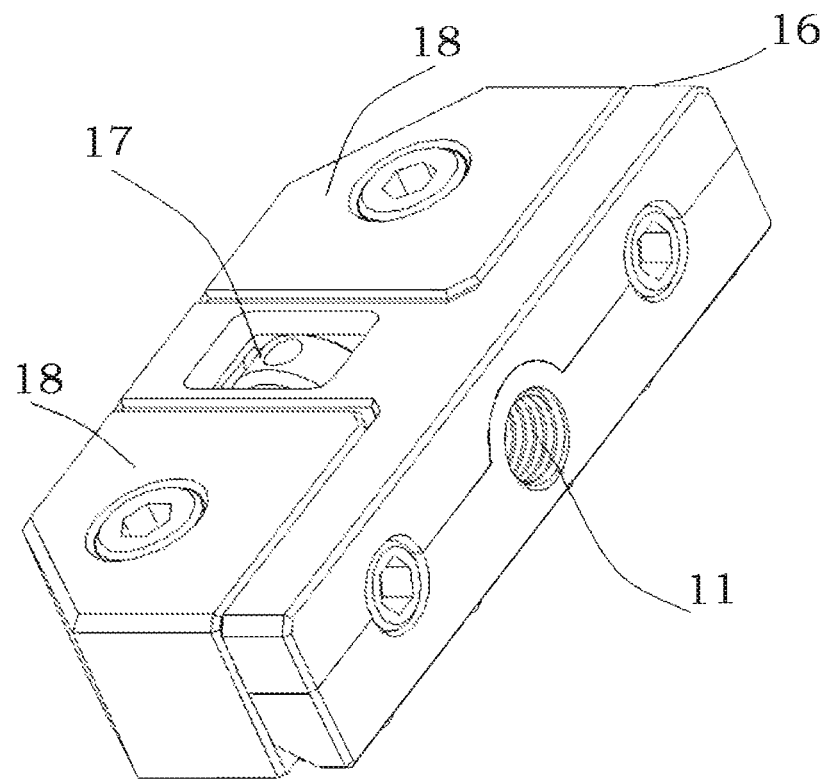
FIG. 8 is a perspective view of the X-axis adjustable mounting member and Y-axis adjustable mounting member.

As shown in FIG. 8, the X-axis adjustable mounting member 101 and the Y-axis adjustable mounting member 102 are respectively provided with a connecting structure 11 suitable for connecting with an accessory. The connecting structure 11 may be a thread hole, a screw or other structure, preferably the connecting structure 11 is a thread hole. As shown in FIGS. 1-3, the accessory may a support leg 12 for supporting the whole LED display screen, a boom 13 for lifting the whole LED display screen, a stereo 14 mounted on the whole LED display screen, or a cabinet 15 hung on the lower end of the whole LED display screen, the connecting structures provided on the X-axis adjustable mounting member and Y-axis adjustable mounting member facilitate connecting a variety of accessories to the LED display screen, which not only can extend the function of the LED display screen, but also can change the function of the LED display screen arbitrarily, especially when the support leg is directly connected to the X-axis adjustable mounting member and Y-axis adjustable mounting member through the connecting structure, so that one type of support legs may be generally used to the LED display screen with different size, thus reducing the production cost. In addition, each of the accessories is directly connected to the X-axis adjustable mounting member and Y-axis adjustable mounting member, therefore the accessories are independent, it won't appear the case that the stereo and the TV box equipment can't be mounted because the support structure is broken.

As shown in FIG. 8, in this embodiment, preferably, the X-axis adjustable mounting member 101 and the Y-axis adjustable mounting member 102 have the same structure, each of the X-axis adjustable mounting member 101 and the Y-axis adjustable mounting member 102 comprises a first fixing frame 16, a first gap adjusting mechanism 17 mounted on the first fixing frame 16, and two first movable blocks 18 movably connected to the first gap adjusting mechanism 17, each of the first movable block 18 is correspondingly connected to the corner of the LED module 100 on the same side, two ends of the first gap adjusting mechanism 17 are respectively connected to the first movable blocks 18, the gap between the LED modules 100 is adjusted by moving the first movable blocks 18 on the two ends toward or away from each other, the connecting structure 11 is disposed on the outer side wall of the first fixing frame 16. The first fixing frame 16 is T-shaped and comprises a transverse frame and a longitudinal frame, the first gap adjusting mechanism 17 is transversely disposed on the longitudinal frame of the first fixing frame 16, the two first movable blocks 18 are respectively disposed on two sides of the longitudinal frame and are connected to the two ends of the first gap adjusting mechanism 17. The structure of the first gap adjusting mechanism 17 is the same as the structure of the X-axis gap adjusting mechanism or Y-axis gap adjusting mechanism of the middle adjustable mounting member 103.

Figure 6:
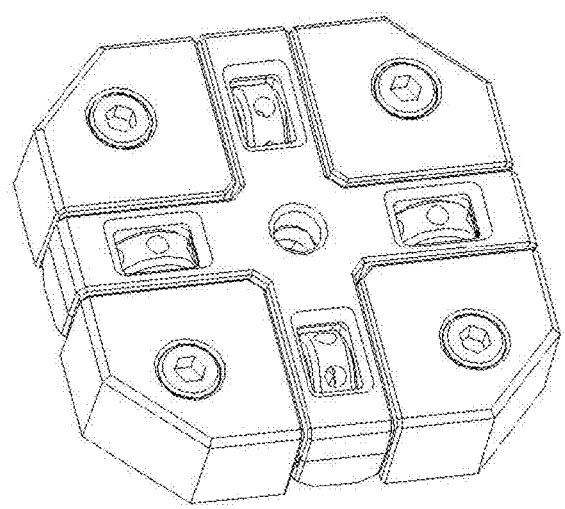
FIG. 6 is a perspective view of the middle adjustable mounting member.
Figure 7:
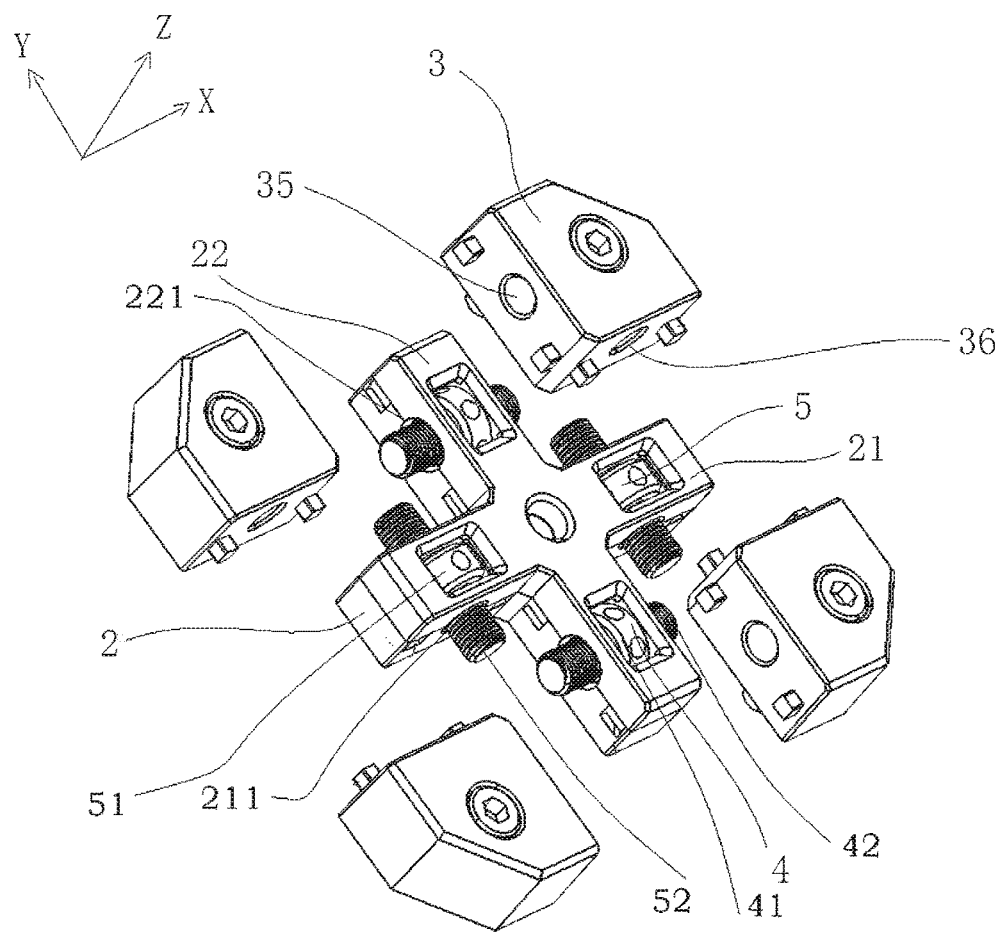
FIG. 7 is an explosive view of FIG. 6.

As shown in FIGS. 6 and 7, in this embodiment, preferably the middle adjustable mounting member 103 comprises:

a second fixing frame 2 comprising a horizontal frame 21 and a vertical frame 22, wherein the extending direction of the horizontal frame 21 is defined as the X-axis direction, and the extending direction of the vertical frame 22 is the Y-axis direction;

four second movable blocks 3 respectively arranged on two sides of the horizontal frame 21 and the vertical frame 22 and showing the grid pattern, wherein the second movable blocks 3 on two sides of the horizontal frame 21 are movable along the X-axis direction, and the second movable blocks 3 on two sides of the vertical frame 22 are movable along the Y-axis direction, and one LED module 100 is mounted on each of the second movable blocks 3;

at least three second gap adjusting mechanisms, respectively mounted on the horizontal frame 21 and the horizontal frame 22, wherein two ends of each of the second gap adjusting mechanisms are respectively connected to two second movable blocks 3, the gap between the LED modules 100 mounted on two second movable blocks 3 is adjusted by moving the first movable blocks 18 on the two ends toward or away from each other, the second gap adjusting mechanism mounted on the horizontal plane 21 is a Y-axis gap adjusting mechanism, the second gap adjusting mechanism mounted on the vertical frame 22 is an X-axis gap adjusting mechanism, the Y-axis gap adjusting mechanism is movably disposed on the horizontal frame 21 and is capable of being moved wholly along the X-axis direction, and the X-axis gap adjusting mechanism is movably disposed on the vertical frame 22 and is capable of being moved wholly along the Y-axis direction.

Preferably, an X-direction strip through hole 211 with a length extending along the X-axis direction is formed on the horizontal frame 21, a Y-direction strip through hole 221 with the length extending along the Y-axis direction is formed on the vertical frame 22, the X-axis gap adjusting mechanism is movably disposed in the Y-direction strip through hole 221, and two ends of the X-axis gap adjusting mechanism extend out of the Y-direction strip through hole 221 to be connected to two second movable blocks 3 on the left and right, to drive the two second movable blocks 3 to move away from or toward each other along the X-axis direction, the Y-axis gap adjusting mechanism is movably disposed in the X-direction strip through hole 211, and two ends of the Y-axis gap adjusting mechanism extend out of the X-direction strip through hole 211 to be connected to two second movable blocks 3 on the top and bottom, to drive the two second movable blocks 3 to move away from or toward each other along the Y-axis direction.

Further more, the second gap adjusting mechanism is an adjusting screw with threads at two ends, the X-axis gap adjusting mechanism is the X-axis adjusting screw 4 and the Y axis gap adjusting mechanism is the Y axis adjusting screw 5, the side of the second movable block 3 facing to the X-axis adjusting screw 4 is provided with an X-axis thread hole 35 suitable for connecting with the X-axis adjusting screw 4, the side of the second movable block 3 facing to the Y-axis adjusting screw 5 is provided with a Y-axis thread hole 36 suitable for connecting with the Y-axis adjusting screw 5. The gap adjusting mechanism with such structure has simple structure, is easy to manufacture and is convenient to adjust.

the X-axis adjusting screw 4 comprises an X-axis adjusting part 41 and two X-axis thread parts 42 fixedly connected with two ends of the X-axis adjusting part 41, the thread directions of the two X-axis thread parts 42 are opposite, the two X-axis thread parts 42 are respectively threaded to the X-axis thread holes 35 on two sides of the X-axis adjusting screw 4, the thread direction of the X-axis thread holes 35 is matched with the X-axis thread parts 42; the Y-axis adjusting screw 5 comprises a Y-axis adjusting part 51 and two Y-axis thread parts 52 fixedly connected with two ends of the Y-axis adjusting part 51, the thread directions of the two Y-axis thread parts 52 are opposite, the two Y-axis thread parts 52 are respectively threaded to the Y-axis thread holes 36 on two sides of the Y-axis adjusting screw 5, the thread direction of the Y-axis thread holes 36 is matched with the Y-axis thread parts 52.

Using the middle adjustable mounting member with above structure mount can achieve the seamless assembly, such that the display screen shows no black line and bright line when seen in the front and does not need to be adjusted by manually padding a material, thus the adjustment effect is good, the adjustment way is simple, and the time for adjustment is saved. Because the Y-axis gap adjusting mechanism is movably disposed on the horizontal frame 21 and is capable of being moved wholly along the X-axis direction, when the gap along the Y-axis direction is adjusted by adjusting two movable blocks 3, the Y-axis gap adjusting mechanism may move along the X-axis direction with the movable blocks 3 with respect to the horizontal frame 21, without interfering the gap adjustment along the X-axis direction implemented by the X-axis gap adjusting mechanism by adjusting two movable blocks 3. Similarly, because the X-axis gap adjusting mechanism is movably disposed on the vertical frame 22 and is capable of being moved wholly along the Y-axis direction, which won't interfere the gap adjustment along the Y-axis direction implemented by the Y-axis gap adjusting mechanism by adjusting two movable blocks 3. And because there are gaps between the X-axis thread hole and the X-axis thread part and between the Y-axis thread hole and the Y-axis thread part, even if between the standard external thread and internal there is also a gap, when one X-axis adjusting screw on the middle adjustable mounting member 103 is adjusted, another X-axis adjusting screw does not interfere with the fine adjustment of the X-axis adjusting screw. Similarly, the adjustment along the Y-axis is the same.

Figure 4:
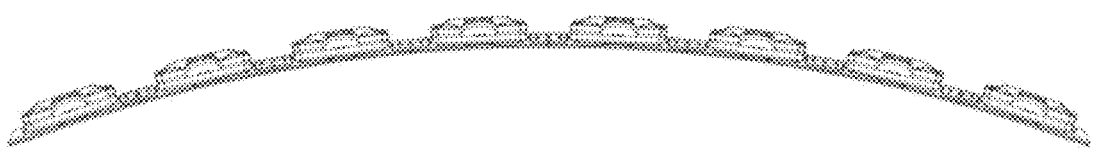
FIG. 4 is a schematic view of the variable LED display screen of the present invention bent into a curved surface.
Figure 5:
FIG. 5 is a schematic view of the variable LED display screen of the present invention bent into an S-shaped surface.
Figure 9:
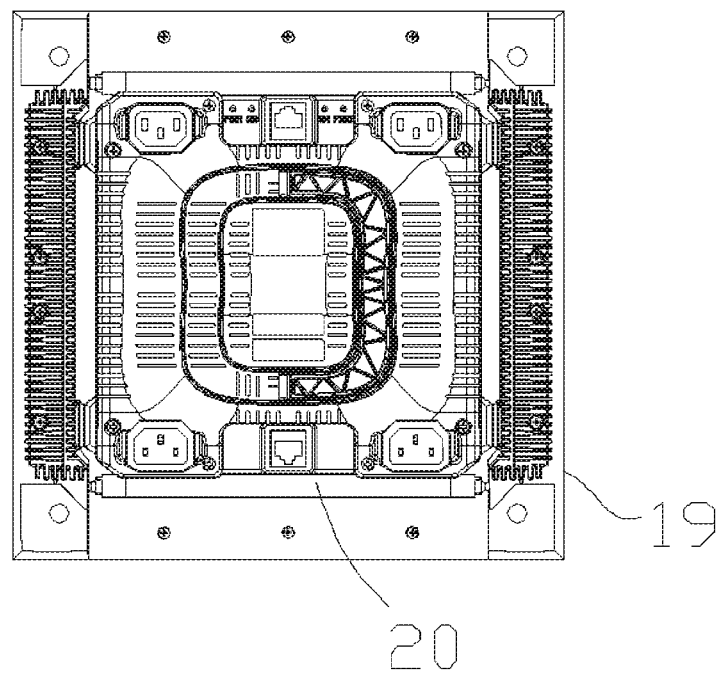
FIG. 9 is a front view of the bendable LED modules.
Figure 10:
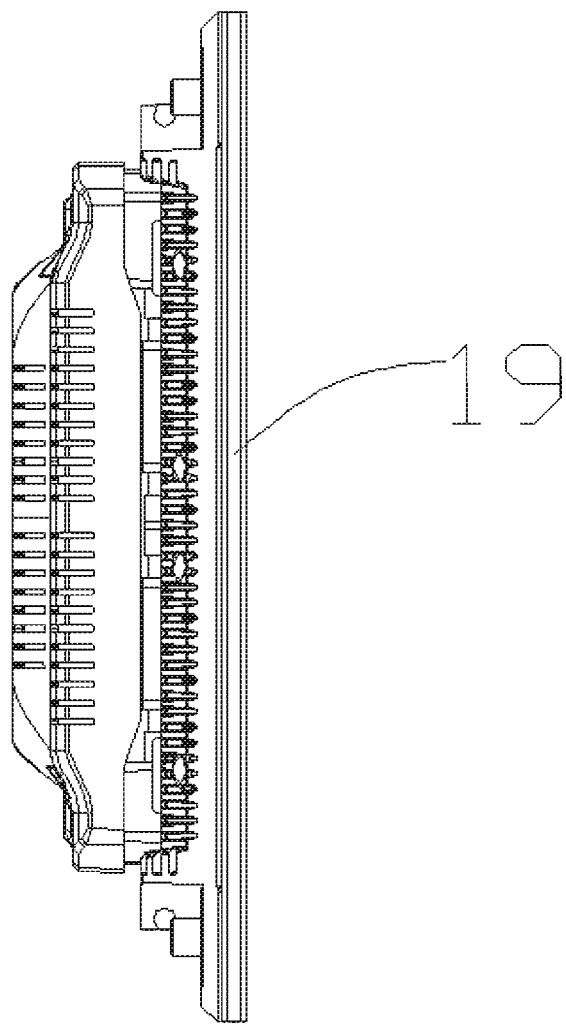
FIG. 10 is a side view of the bendable LED modules.

Further more, the LED modules 100 may be a bendable LED modules, such that the variable LED display screen of the present invention not only allows the change in size by changing the number of the LED modules, but also allows change in shape. The LED display screen may be plane shaped, and also may be adjusted to curved surface and the S-shaped surface, as shown in FIGS. 4 and 5. There are many structures for achieving the bendable LED module, as shown in FIGS. 9 and 10, in this embodiment, preferably the bendable LED module comprises an elastic component layer 19 on which a plurality of light emitting assemblies are arranged; and an adjusting part 20 which acts on the back of the elastic component layer 20 and pulls or pushes the two sides of the elastic component layer 19, to bend the elastic component layer 19 into an inner arc or outer arc.

Clearly, the above-described embodiments are merely made to clearly illustrate the given examples, and do not intend to limit the implementations. Ordinary skilled person in the art may make other changes or variants in different form based on the above description. It doesn't need to and can't list all embodiments herein. Obvious changes or variants evolved therefrom are still in the protection scope of the utility model.

What is claimed is:

1. A variable LED display screen comprising a plurality of LED modules and a plurality of mounting assemblies arranged among adjacent LED modules and configured to connecting the LED modules together to form the display screen, wherein the mounting assemblies are adjustable mounting assemblies, the mounting assemblies are capable of finely adjusting the relative gaps between adjacent LED modules connected with the mounting assemblies; wherein the adjustable mounting assemblies comprise a middle adjustable mounting member disposed among four LED modules in a grid pattern, and the middle adjustable mounting member is connected to a corner of each of the four LED modules to adjust a gap between the two adjacent LED modules of the four LED modules that are positioned along an X-axis direction and to adjust a gap between the two adjacent LED modules of the four LED modules that are positioned along a Y-axis direction.

2. The variable LED display screen of claim 1, wherein: the adjustable mounting assemblies comprise an X-axis adjustable mounting member configured to adjust the relative gap between adjacent LED modules along X-axis direction, and a Y-axis adjustable mounting member configured to adjust the relative gap between adjacent LED modules along Y-axis direction.

3. The variable LED display screen of claim 2, wherein: the X-axis adjustable mounting member is disposed between the LED modules formed an edge of the display screen parallel with the X-axis direction; the Y-axis adjustable mounting member is disposed between the LED modules formed the edge of the display screen parallel with the Y-axis direction.

4. The variable LED display screen of claim 3, wherein the X-axis adjustable mounting member and the Y-axis adjustable mounting member are respectively provided with a connecting structure suitable for connecting with an accessory.

5. The variable LED display screen of claim 4, wherein the connecting structure is a thread hole.

6. The variable LED display screen of claim 4, wherein the accessory is a support leg for supporting the whole LED display screen, a boom for lifting the whole LED display screen, a stereo mounted on the whole LED display screen, or a cabinet hung on the lower end of the whole LED display screen.

7. The variable LED display screen of claim 3, wherein the X-axis adjustable mounting member and the Y-axis adjustable mounting member have the same structure, each of the X-axis adjustable mounting member and the Y-axis adjustable mounting member comprises a first fixing frame, a first gap adjusting mechanism mounted on the first fixing frame, and two first movable blocks movably connected to the first gap adjusting mechanism, each of the first movable block is correspondingly connected to the corner of the LED module on the same side, two ends of the first gap adjusting mechanism are respectively connected to the first movable blocks, the gap between the LED modules is adjusted by moving the first movable blocks on the two ends toward or away from each other, the connecting structure is disposed on the outer side wall of the first fixing frame.

8. The variable LED display screen of claim 7, wherein the first fixing frame is T-shaped and comprises a transverse frame and a longitudinal frame, the first gap adjusting mechanism is transversely disposed on the longitudinal frame of the first fixing frame, the two first movable blocks are respectively disposed on two sides of the longitudinal frame and are connected to the two ends of the first gap adjusting mechanism.

9. The variable LED display screen of claim 3, wherein the middle adjustable mounting member comprises:
a second fixing frame comprising a horizontal frame and a vertical frame, wherein the extending direction of the horizontal frame is defined as the X-axis direction, and the extending direction of the vertical frame is the Y-axis direction;
four second movable blocks respectively arranged on two sides of the horizontal frame and the vertical frame and showing the grid pattern, wherein the second movable blocks on two sides of the horizontal frame are movable along the X-axis direction, and the second movable blocks on two sides of the vertical frame are movable along the Y-axis direction, and one LED module is mounted on each of the second movable blocks;
at least three second gap adjusting mechanisms, respectively mounted on the horizontal frame and the horizontal frame, wherein two ends of each of the second gap adjusting mechanisms are respectively connected to two second movable blocks, the gap between the LED modules mounted on two second movable blocks is adjusted by moving the first movable blocks on the two ends toward or away from each other, the second gap adjusting mechanism mounted on the horizontal plane is a Y-axis gap adjusting mechanism, the second gap adjusting mechanism mounted on the vertical frame is an X-axis gap adjusting mechanism, the Y-axis gap adjusting mechanism is movably disposed on the horizontal frame and is capable of being moved wholly along the X-axis direction, and the X-axis gap adjusting mechanism is movably disposed on the vertical frame and is capable of being moved wholly along the Y-axis direction.

10. The variable LED display screen of claim 9, wherein an X-direction strip through hole with a length extending along the X-axis direction is formed on the horizontal frame, a Y-direction strip through hole with the length extending along the Y-axis direction is formed on the vertical frame, the X-axis gap adjusting mechanism is movably disposed in the Y-direction strip through hole, and two ends of the X-axis gap adjusting mechanism extend out of the Y-direction strip through hole to be connected to two second movable blocks on the left and right, to drive the two second movable blocks to move away from or toward each other along the X-axis direction, the Y-axis gap adjusting mechanism is movably disposed in the X-direction strip through hole, and two ends of the Y-axis gap adjusting mechanism extend out of the X-direction strip through hole to be connected to two second movable blocks on the top and bottom, to drive the two second movable blocks to move away from or toward each other along the Y-axis direction.

11. The variable LED display screen of claim 10, wherein the second gap adjusting mechanism is an adjusting screw with threads at two ends, the X-axis gap adjusting mechanism is the X-axis adjusting screw and the Y axis gap adjusting mechanism is the Y axis adjusting screw, the side of the second movable block facing to the X-axis adjusting screw is provided with an X-axis thread hole suitable for connecting with the X-axis adjusting screw, the side of the second movable block facing to the Y-axis adjusting screw is provided with a Y-axis thread hole suitable for connecting with the Y-axis adjusting screw.

12. The variable LED display screen of claim 11, wherein the X-axis adjusting screw comprises an X-axis adjusting part and two X-axis thread parts fixedly connected with two ends of the X-axis adjusting part, the thread directions of the two X-axis thread parts are opposite, the two X-axis thread parts are respectively threaded to the X-axis thread holes on two sides of the X-axis adjusting screw, the thread direction of the X-axis thread holes is matched with the X-axis thread parts; the Y-axis adjusting screw comprises a Y-axis adjusting part and two Y-axis thread parts fixedly connected with two ends of the Y-axis adjusting part, the thread directions of the two Y-axis thread parts are opposite, the two Y-axis thread parts are respectively threaded to the Y-axis thread holes on two sides of the Y-axis adjusting screw, the thread direction of the Y-axis thread holes is matched with the Y-axis thread parts.

13. The variable LED display screen of claim 12, wherein the bendable LED module comprises an elastic component layer on which a plurality of light emitting assemblies are arranged; and an adjusting part which acts on the back of the elastic component layer and pulls or pushes the two sides of the elastic component layer, to bend the elastic component layer into an inner arc or outer arc.

14. The variable LED display screen of claim 1, wherein the LED module is a bendable LED module.

15. The variable LED display screen of claim 1, wherein the middle adjustable mounting member is configured to make linear adjustment between the two adjacent LED modules of the four LED modules that are positioned along the X-axis direction and to make linear adjustment between the two adjacent LED modules of the four LED modules that are positioned along the Y-axis direction.

16. The variable LED display screen of claim 1, wherein the middle adjustable mounting member by itself is configured to make linear adjustment of the four LED modules in the grid pattern in both the X-axis direction and the Y-axis direction.

* * * * *